United States Patent
Lin et al.

(10) Patent No.: US 6,383,935 B1
(45) Date of Patent: May 7, 2002

(54) METHOD OF REDUCING DISHING AND EROSION USING A SACRIFICIAL LAYER

(75) Inventors: Cheng Chung Lin, Taipei; Chen Hua Yu; Tsu Shih, both of Hsin-Chu; Weng Chang, Taipei, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/687,162

(22) Filed: Oct. 16, 2000

(51) Int. Cl.⁷ .................... H01L 21/4763; H01L 21/44; H01L 21/302
(52) U.S. Cl. ................ 438/692; 438/633; 438/687; 438/688; 438/742; 438/754
(58) Field of Search ................. 438/692, 691, 438/687, 688, 633, 693, 742, 751, 756, 725; 216/38, 39, 89, 78

(56) References Cited

U.S. PATENT DOCUMENTS

| 5,618,381 A | 4/1997 | Doan et al. ............... 438/633 |
| 5,683,924 A | * 11/1997 | Chan et al. ............... 438/300 |
| 5,731,245 A | 3/1998 | Joshi et al. ............... 438/705 |
| 5,885,900 A | 3/1999 | Schwartz ............... 438/697 |
| 6,056,864 A | 5/2000 | Cheung ............... 205/222 |

FOREIGN PATENT DOCUMENTS

JP  2000-3491 A  * 8/2000

* cited by examiner

Primary Examiner—Ha Tran Nguyen
(74) Attorney, Agent, or Firm—George O. Saile; Stephen B. Ackerman

(57) ABSTRACT

Chemical mechanical polishing (CMP) is known to cause dishing when the surface being planarized includes a wide trench partially filled with metal. This problem has been overcome by first filling the trench with a material whose polishing rate under CMP is similar to that of the metal in the trench. Spin-coating is used for this so that only the trench gets filled. After CMP, any residue of this material is removed, leaving behind a surface that has been planarized to the intended extent without the introduction of significant dishing and with minimum erosion of the metal.

16 Claims, 5 Drawing Sheets

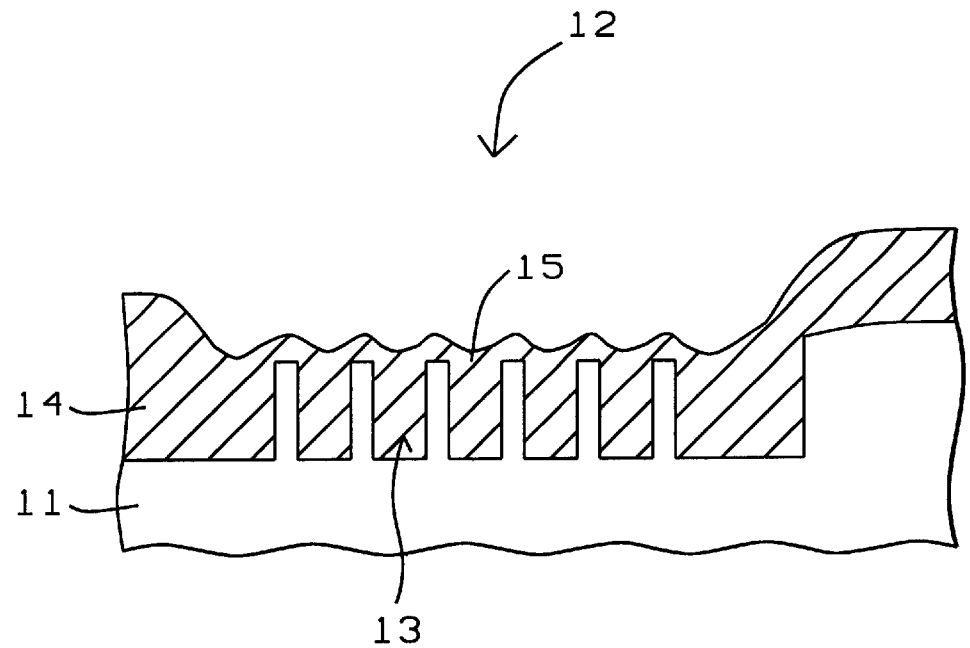
*FIG. 1 - Prior Art*
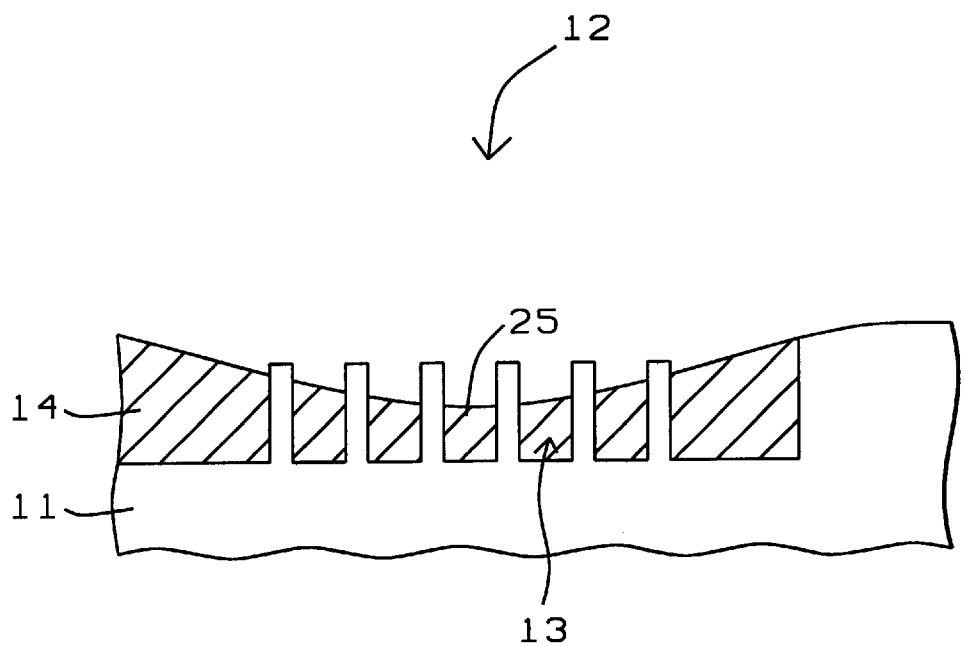
*FIG. 2 - Prior Art*

METHOD OF REDUCING DISHING AND EROSION USING A SACRIFICIAL LAYER

FIELD OF THE INVENTION

The invention relates to the general field of integrated circuits with particular reference to chemical mechanical polishing and avoidance of dishing problems.

BACKGROUND OF THE INVENTION

Chemical mechanical polishing (CMP) is widely used as a method for planarizing surfaces since the advancing etch front associated with CMP tends to be independent of both the topography and compositional variations within the surface being treated. However, since the pad used for the CMP is soft, it has a slight tendency to follow concavities with the result that, over time, dishing occurs over soft or open areas.

Referring now to FIG. 1, we see there a substrate 11 whose upper surface includes a number of trenches or via holes such as 13. A temporary depression 12 has been formed and partially filled with metal layer 14. Sufficient metal was used to overfill the vias so that the surface 15 of the metal layer was about 2 microns above the floor of 12.

FIG. 2 shows the same structure after conventional CMP according to the practices of the prior art. As intended, the thickness of the metal layer 14 has been reduced above all surfaces outside the trench. However, in addition, the metal surface 25 inside the trench has not been left entirely untouched, as was intended. Instead, some dishing has occurred together with some chemical erosion of the metal.

The present invention discloses a solution to this problem that prevents dishing and erosion without affecting the main process.

A routine search of the prior art was performed. The following references of interest were found: In U.S. Pat. No. 5,618,381, Doan et al. show a CMP process that uses a protective layer that polishes significantly more slowly than the metal being planarized. This causes material in the crests to be removed faster than material in the valleys, thereby enhancing planarization. Cheung, in U.S. Pat. No. 6,056,864, shows an ECD copper planarization process where the copper is wet etched or electrolytically etched and the subjected to CMP. In U.S. Pat. No. 5,885,900, Schwartz shows a global planarization process for conductive layers using a wet etch back step while Joshi et al. (U.S. Pat. No. 5,731,254) show using a CuGe hard cap during CMP.

SUMMARY OF THE INVENTION

It has been an object of the present invention to provide a process for chemical mechanical polishing of a surface that includes a dense trench array filled with metal.

Another object has been that said process lead to little or no dishing of the trenches.

A further object has been that said process lead to little or no erosion of the metal in the trenches or of the surrounding oxide.

These processes have been achieved by first covering the trenches with a material whose polishing rate under CMP is similar to that of the metal in the trenches. Spin-coating is used so that only the depression in which the trenches lie gets filled. After CMP, any residue of this material is removed leaving behind a surface that has been planarized to the intended extent without the introduction of significant dishing and with minimum erosion of the metal.

BRIEF DESCRIPTION OF THE DRAWINGS

FIG. 1 shows a substrate in whose upper surface is a trench array that has been over-filled with metal.

FIG. 2 illustrates the result of performing CMP on the structure of FIG. 1 using processes of the prior art.

DESCRIPTION OF THE PREFERRED EMBODIMENTS

The process of the present invention will be disclosed through a description of its application to planarizing a silicon integrated circuit having on its surface trenches that have been filled with copper, but it will be understood that the invention is more general than this and may be applied to planarizing any substrate on whose surface is an array of trenches and/or via holes that have been filled with a metal.

Referring once more to FIG. 1, the process of the present invention begins with the provision of substrate 11 which could be a partially completed silicon integrated circuit. On its upper surface is temporary depression 12. An array of trenches and/or via holes, such as 13, that extend from the bottom of the depression down to some lower level within the integrated circuit, is then formed. Said array has a trench density ([cumulative trench width]/[total array width]) in excess of about 90%. A layer 14 of metal such as copper is then deposited on all exposed surfaces to a thickness that is sufficient to over-fill the via holes. Other materials that could be used in the general case include tungsten, aluminum, silver, gold and silicon oxide. Note that when copper is the metal of choice a preferred method for its deposition is to first deposit a conductive seed layer and to then build up the copper layer by means of electroplating.

Figure 3:
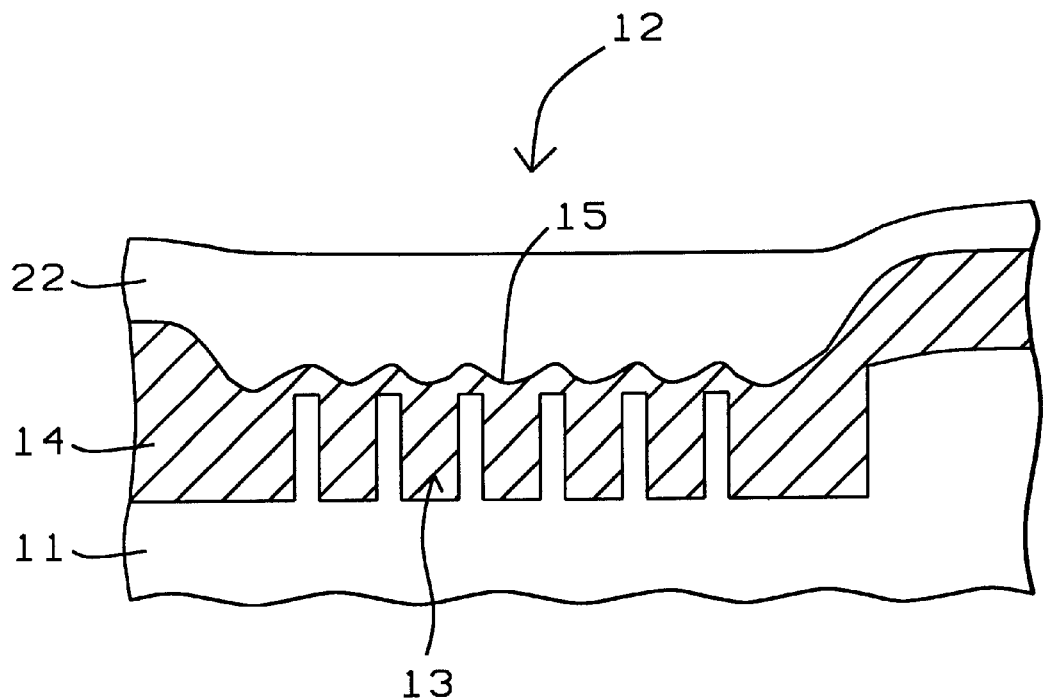
FIG. 3 is the structure of FIG. 1 in which the metal has been covered with a sacrificial layer.

Now follows a key feature of the invention which is illustrated in FIG. 3. Using a spin-on technique, the depression is filled with a layer of material 22 that has a polishing rate, for chemical mechanical polishing, that is similar to that of metal 14 (which would be copper if substrate 11 were a silicon integrated circuit). In general, the closer the two polishing rates, the more effective the invention, with a difference in the polishing rates no greater than about 20% being preferred. Examples of suitable materials include spin-on glass, hydrogen silsesquioxane (HSQ), and photoresist. Typically, the polishing rate for the selected material is between about 2,500 and 5,500 Angstroms per minute.

Figure 4:
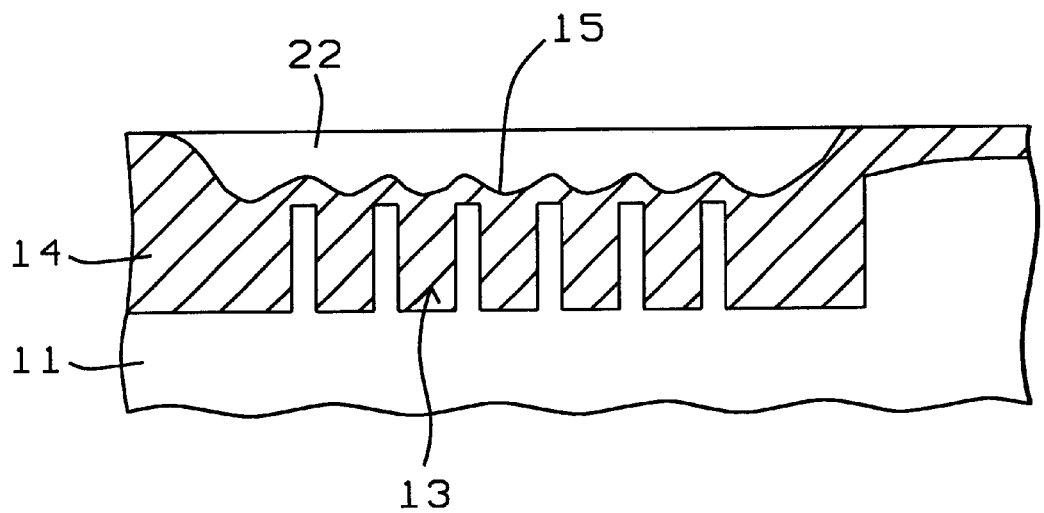
FIG. 4 is the structure of FIG. 3 after partial CMP.
Figure 5:
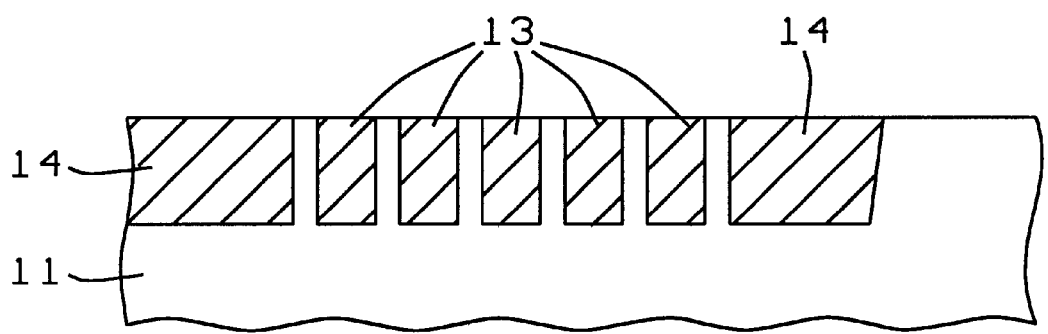
FIG. 5 shows the appearance of the structure at the conclusion of the process of the present invention.

With layer 22 in place, the integrated circuit is subjected to chemical mechanical polishing in the usual way until most excess metal 14 removed, as shown in FIG. 4. CMP then continues until no excess metal remains above the top level of the trenches/via holes, as illustrated in FIG. 5.

It has been our experience that, if the above process is followed, up to about 500 Angstroms of metal (within the original depression 12) will be found to have been removed as a result of dishing, once chemical mechanical polishing has been terminated. Similarly, up to about 1,800 Angstroms of oxide outside the trenches will be found to have been removed as a result of erosion that occurred during chemical mechanical polishing. Stated differently, the amount of metal that remains in the trench at the conclusion of chemical mechanical polishing is greater than about 9,000 Angstroms (in this case).

Figure 6:
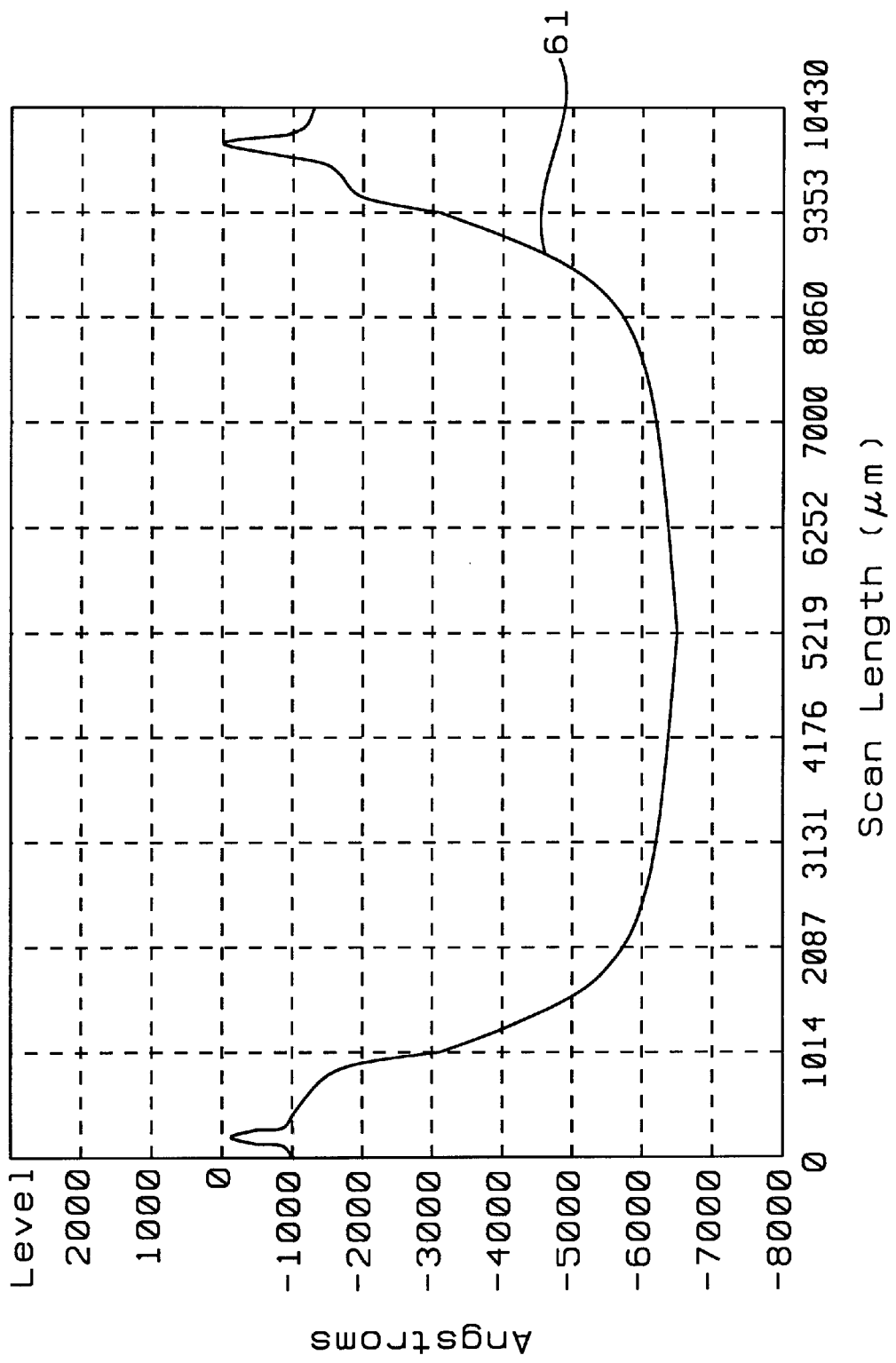
FIG. 6 is a profile of a trench after CMP performed using prior art processes.
Figure 7:
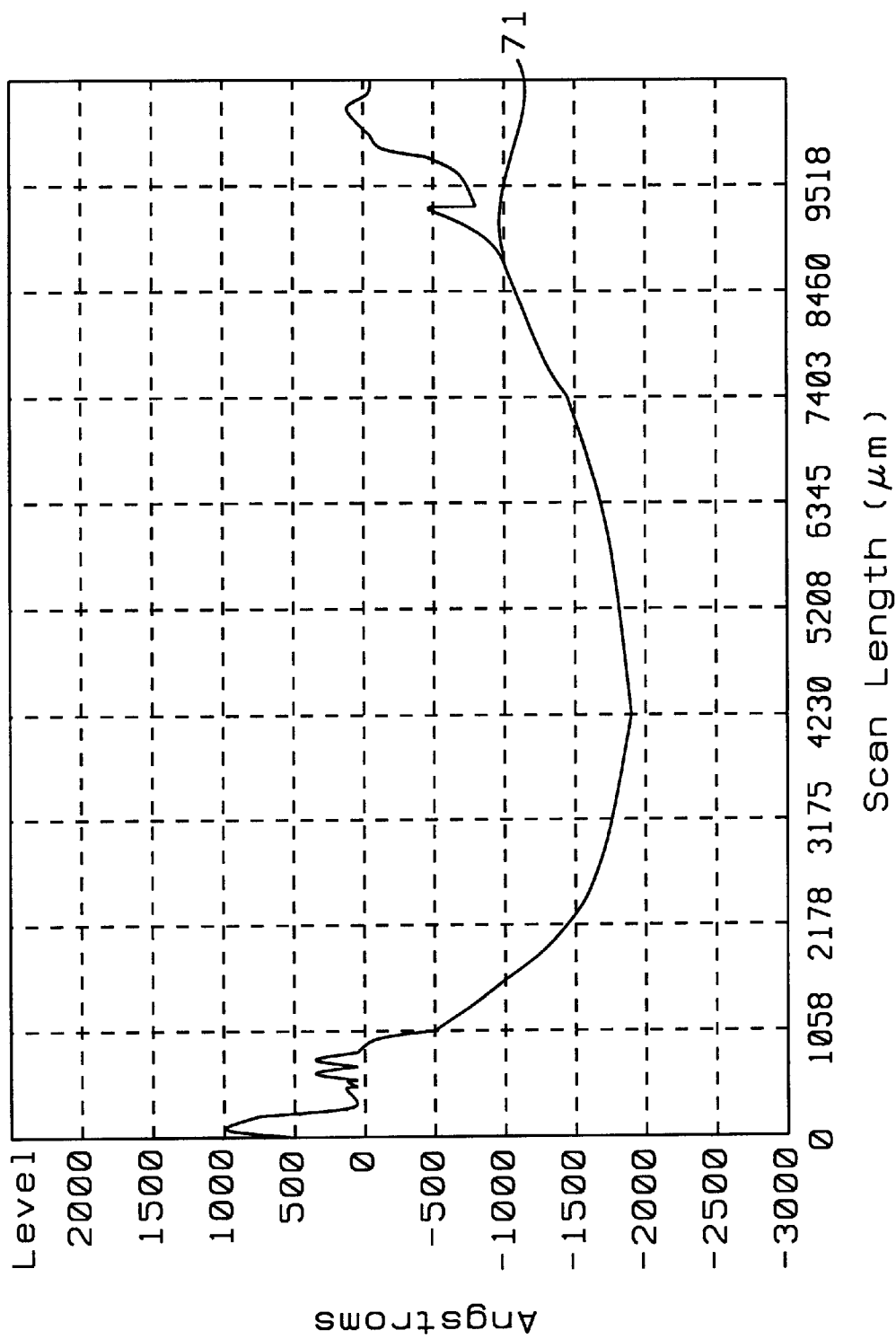
FIG. 7 is a profile of a trench after CMP performed in accordance with the teachings of the present invention.

Data confirming the effectiveness of the above-described process is presented in FIGS. 6 and 7. Curve 61 in FIG. 6 is a profile of a trench array after CMP based on prior art techniques. It shows 6,500 Angstroms of erosion within a 10,000 micron profile scan. Curve 71 in FIG. 7 is a similar profile for a trench subjected to CMP in accordance with the teachings of the present invention. As can be seen only 1,800 Angstroms of erosion occurred within a similar (9,500 Angstroms) profile scan. We note here that the effectiveness of this approach is independent of trench depth.

While the invention has been particularly shown and described with reference to the preferred embodiments thereof, it will be understood by those skilled in the art that various changes in form and details may be made without departing from the spirit and scope of the invention.

What is claimed is:

1. A process to reduce dishing during chemical mechanical polishing, comprising the steps of:

providing a structure that includes a substrate having an upper surface in which there is a depression within which there is a trench array having a depth;

depositing a layer of metal on said upper surface, including the trench array, to a thickness that is greater than said trench array depth;

by means of a spin-on technique, coating the metal layer with a layer of material that is different from said layer of metal and that has a polishing rate, for chemical mechanical polishing, that differs from that of said metal by no more than about 20%;

then subjecting the structure with said metal and said material formed thereon to chemical mechanical polishing whereby an amount of metal and material is removed; and then removing any of the material still remaining wherein the trench array has a trench density that is greater than about 90%.

2. The process described in claim 1 wherein said process is independent of trench array depth.

3. The process described in claim 1 where said material is selected from the group consisting of spin-on glass, HSQ, and photoresist.

4. The process described in claim 1 wherein, at the conclusion of chemical mechanical polishing, less than about 500 Angstroms of metal inside the trench array has been removed as a result of dishing.

5. The process described in claim 1 wherein less than about 1,800 Angstroms of oxide is removed as a result of erosion that occurred during chemical mechanical polishing.

6. The process described in claim 1 wherein said polishing rate is between about 2,500 and 5,500 Angstroms per minute.

7. The process described in claim 1 wherein greater than about 90% of the metal remains in the trench array at the conclusion of chemical mechanical polishing.

8. The process described in claim 1 wherein the metal is selected from the group consisting of tungsten, aluminum, silver, and gold.

9. A process for planarization, comprising the steps of:

providing a partially completed silicon integrated circuit having an upper surface within which there is a depression;

in said depression, forming trenches and via holes, having a depth, that extend from said upper surface for a distance into the integrated circuit;

depositing a layer of copper on said upper surface, including the trenches and via holes, to a thickness that is sufficient to over-fill the trenches and via holes and that is greater than said depth;

by means of a spin-on technique, covering the layer of copper with a layer of material, other than copper, that has a polishing rate, for chemical mechanical polishing, that differs from that of copper by no more than about 20%;

then subjecting the integrated circuit with said copper and said material formed thereon to chemical mechanical polishing whereby an amount of metal and material is removed;

then removing any of the material still remaining; and completing fabrication of the integrated circuit wherein the density of the trenches and via holes is greater than about 90%.

10. The process described in claim 9 wherein said process is independent of said trench and via hole depth.

11. The process described in claim 9 wherein said material is selected from the group consisting of spin-on glass, photoresist, and HSQ.

12. The process described in claim 9 wherein, at the conclusion of chemical mechanical polishing, less than about 500 Angstroms of copper inside the trenches has been removed as a result of dishing.

13. The process described in claim 9 wherein less than about 1,800 Angstroms of oxide is removed as a result of erosion that occurred during chemical mechanical polishing.

14. The process described in claim 9 wherein said polishing rate is between about 2,500 and 5,500 Angstroms per minute.

15. The process described in claim 9 wherein an amount of copper greater than about 90% of trench depth remains in the trenches and via holes at the conclusion of chemical mechanical polishing.

16. The process described in claim 9 wherein said depositing a layer of copper comprises, depositing a conductive seed layer and then depositing the copper layer by means of electroplating.

* * * * *